United States Patent [19]

Adler et al.

[11] Patent Number: 5,512,824
[45] Date of Patent: Apr. 30, 1996

[54] MAGNETIC FIELD PROBE INCLUDING SYMMETRICAL PLANAR LOOPS FOR ELIMINATING THE CURRENT INDUCED BY THE E-FIELD

[76] Inventors: Zdenek (Danny) Adler, West Hempstead; Refael Popovich, Bellmore, both of N.Y.

[21] Appl. No.: 260,337

[22] Filed: Jun. 15, 1994

[51] Int. Cl.⁶ .................... G01R 33/02; G01R 33/025
[52] U.S. Cl. ............................ 324/258; 324/244
[58] Field of Search .................. 324/244–258, 324/95, 72.5; 343/720, 728, 842

[56] References Cited

U.S. PATENT DOCUMENTS

| | | | |
|---|---|---|---|
| 3,641,439 | 2/1972 | Aslan | 435/363 |
| 3,721,900 | 3/1973 | Andrews | 324/95 |
| 3,789,299 | 1/1974 | Aslan | 324/95 |
| 3,794,914 | 2/1974 | Aslan | 324/95 |
| 3,812,438 | 5/1974 | Hopfer | 333/97 |
| 3,863,142 | 1/1975 | Werle | 324/258 |
| 3,919,638 | 11/1975 | Belden, Jr. | 324/95 |
| 3,931,573 | 1/1976 | Hopfer | 324/106 |
| 4,008,477 | 2/1977 | Babij et al. | 343/701 |
| 4,023,093 | 5/1977 | Aslan | 324/43 |
| 4,207,518 | 6/1980 | Hopfer | 324/95 |
| 4,277,744 | 7/1981 | Audone et al. | 324/72 |
| 4,305,785 | 12/1981 | Praeg | 324/258 X |
| 4,392,108 | 7/1983 | Hopfer | 324/95 |
| 4,518,912 | 5/1985 | Aslan | 324/95 |
| 4,588,993 | 5/1986 | Babij et al. | 343/351 |
| 4,631,473 | 12/1986 | Honda | 324/95 X |
| 4,634,969 | 1/1987 | Edlin et al. | 324/258 X |
| 5,256,960 | 10/1993 | Novini | 324/247 X |

FOREIGN PATENT DOCUMENTS

| | | |
|---|---|---|
| 1009936 | 6/1952 | France . |
| 622211 | 4/1949 | United Kingdom . |

OTHER PUBLICATIONS

U.S. National Bureau of Standards–Isotropic Magnetic Field Meter (MFM–10) 300 KHz to 100 MH2. J. E. Cruz, L. D. Driver, M. Kanoa–Oct. 1985.

IEEE Transactions on Antennas and Propagation the Loop Antenna as a Probe–H. Whiteside and R. W. P. King–pp. 291–297, May 1964.

IEEE Transactions on Antennas and Propagation–Sensor's for Electromagnetic Pulse Measurements Both Inside and Away From Nuclear Source Regions–Baum, Giles, O'Neill and Sower–pp. 22–25, Jan 1978.

IEEE Transactions or Industrial Electronic Control Instrumentation–Precision Sensor for the Magnetic Field Intensity at Microwave and Millimeter–wave Frequencies–F. J. Tischer vol. 17, No. 2, Apr. 1970 pp. 185–187.

IEEE Transactions or Electromagnetic Compatibility–H- -Field Sensor Measurement Errors in the Near–Field of a Magnetic Dipole Source–Steven Iskra and Ian McFarlane vol. 31, No. 3, Aug. 1989–pp. 306–311.

Measurement of the Magnetic Field Very Close to AR RF Source–T. M. Babij, Q. Balzano, T. S. Manning pp. 57–60, no month 194 IEEE.

IEEE Transactions on Electromagnetic Compatibility, vol. 35, No. 1, Feb. 1993–pp. 96–98.

IEEE Transactions on Instrumentation and Measurement, An Ultra Broad–Band (200 KHz–26 GHz) High–Sensitivity Probe Samuel Hopfer and Zderer Adler, vol. IM–29, No. 4, Dec. 1980.

IEEE Transactions on Instrumentation and Measurement- -Broad–Band Isotropic Electromagnetic Radiation Monitor; Edward Aslan–vol. IM–21, No. 4. Nov. 1992 pp. 421–424.

Proceedings of the IEEE–NBS Field–Strength Standards and Measurements (30 Hz to 1000 MHz); Frank M. Greene vol. 55, No. 6, Jun. 1967, pp. 970–981.

General Microwave Full Line Catalog Components and Instruments, no month 1991, pp. 178–191.

Primary Examiner—Sandra L. O'Shea
Assistant Examiner—Roger Phillips
Attorney, Agent, or Firm—Volpe and Koenig

[57] ABSTRACT

An H-field probe for a radiation measuring system includes pairs of symmetrical planar magnetic loops for detecting electromagnetic (EM) radiation. EM radiation induces E-field and H-field currents in the loops. The individual loops of each pair are electrically coupled such that the E-field induced currents cancel while the H-field induced currents combine. The symmetrical construction results in virtually complete discrimination of the E-field.

20 Claims, 5 Drawing Sheets

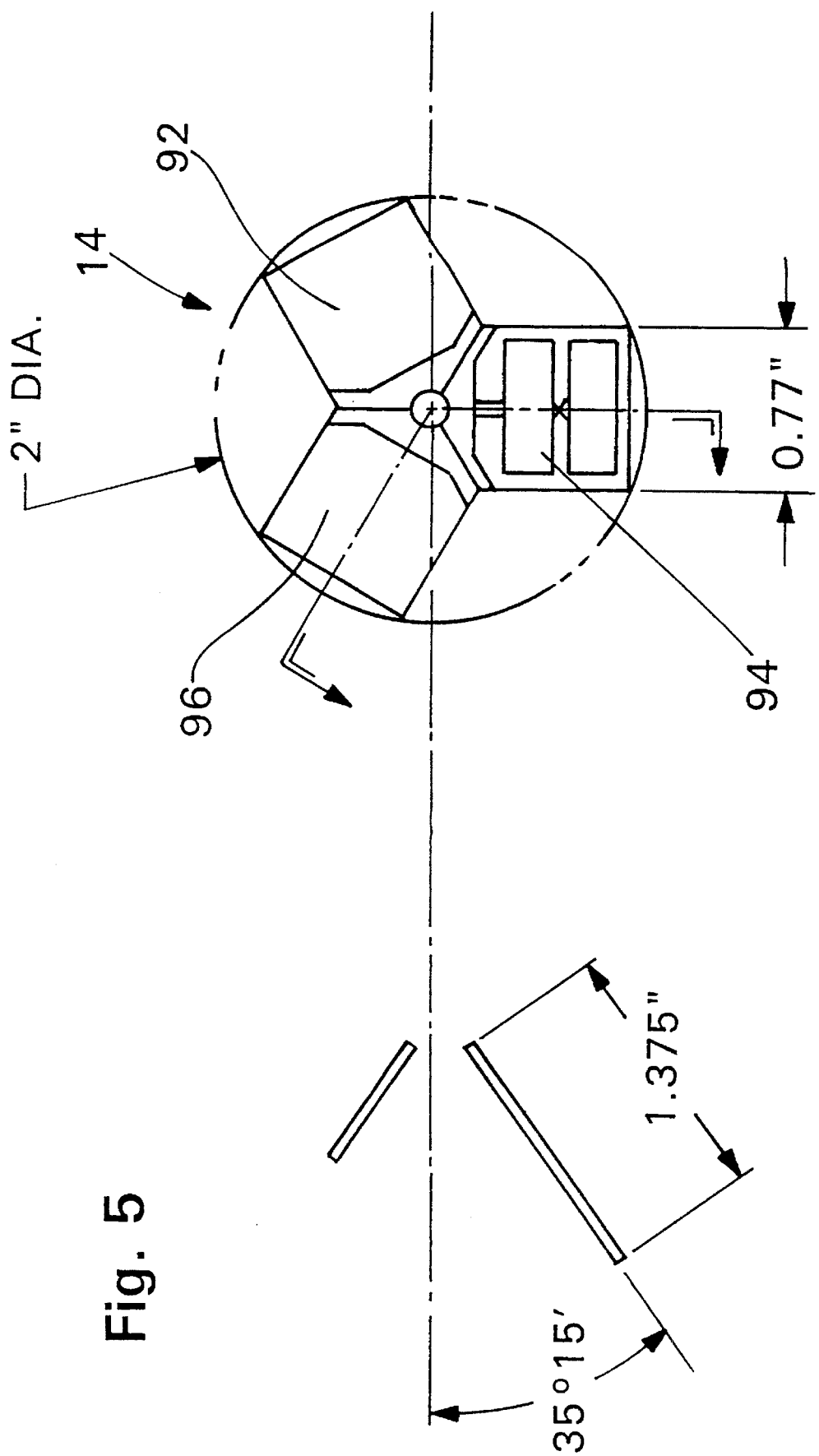

MAGNETIC FIELD PROBE INCLUDING SYMMETRICAL PLANAR LOOPS FOR ELIMINATING THE CURRENT INDUCED BY THE E-FIELD

This invention relates generally to devices which detect electromagnetic energy. More particularly, the invention relates to a device which accurately detects and measures the magnetic field component of an electromagnetic field in the near-field region of an electromagnetic source.

BACKGROUND OF THE INVENTION

Electromagnetic fields (EM fields) are measured by devices which detect either the electric field (E-field) or magnetic field (H-field) components of the electromagnetic field. Conventionally, electric dipole antennas are used to detect E-fields and magnetic loops are used to detect H-fields.

In a transverse EM field, such as free space, the relationship between E- and H- fields is fixed and is independent of frequency. Under such conditions, one type of sensor may be substituted for another to determine the strength of both fields, as well as the power density. However, in the vicinity close to the source of radiation or a reflecting surface, the "near-field" region, the relationship is not fixed.

The extent of the near-field region depends on the frequency of the electromagnetic waves. At frequencies above 1000 MHz, the region is short and for all practical purposes insignificant. At lower frequencies, where the near-field region may extend from several centimeters to hundreds of meters, measurements of both E-field and H-field components are often required.

Sensing devices may be used in close proximity to a human body, such as personal dosimeters worn on a pocket or belt. In such cases, only the H-field component can be measured reliably, since the E-field can induce surface currents in the body, which result in both absorption as well as the reflection of the rf energy.

E-field probes possess an inherent H-field discrimination, since the induced currents in the dipole antenna are due to the E-field only. In H-field magnetic loop detection, however, both H-field and E-field induced currents flow within the enclosed loop. This results in undesirable errors in measuring the H-field, since the combined rf current is dependent on the E-field polarization.

A common technique for solving the problem of undesirable E-field induced currents in H-field detectors, as disclosed in U.S. Pat. No. 4,023,093, is to shield the magnetic loops. Theoretically, E-field induced currents cannot exist within a completely shielded loop. However, in order to measure the loop current, the shield integrity must be compromised. In practice, maintaining an effective shield over a wide frequency band is problematic.

SUMMARY OF THE INVENTION

An improved H-field probe for a radiation measuring system is disclosed. The probe includes pairs of symmetrical planar magnetic loops for detecting electromagnetic (EM) radiation.

EM radiation induces E-field and H-field currents in the loops. The individual loops of each pair are electrically coupled such that the E-field induced currents cancel while the H-field induced currents combine. The symmetrical construction results in virtually complete discrimination of the E-field.

Accordingly, it is an object of the present invention to provide a radiation measuring system having an H-field probe which does not require shielding against the E-field component of an EM field.

Further objects and advantages of the invention will become apparent to those of ordinary skill in the art from the following specification and claims.

BRIEF DESCRIPTION OF THE DRAWINGS

FIG. 5 is a schematic illustration of a plurality of symmetric magnetic loop pairs assembled in an H-field probe made in accordance with the teachings of the present invention.

DESCRIPTION OF THE PREFERRED EMBODIMENT

Figure 1:
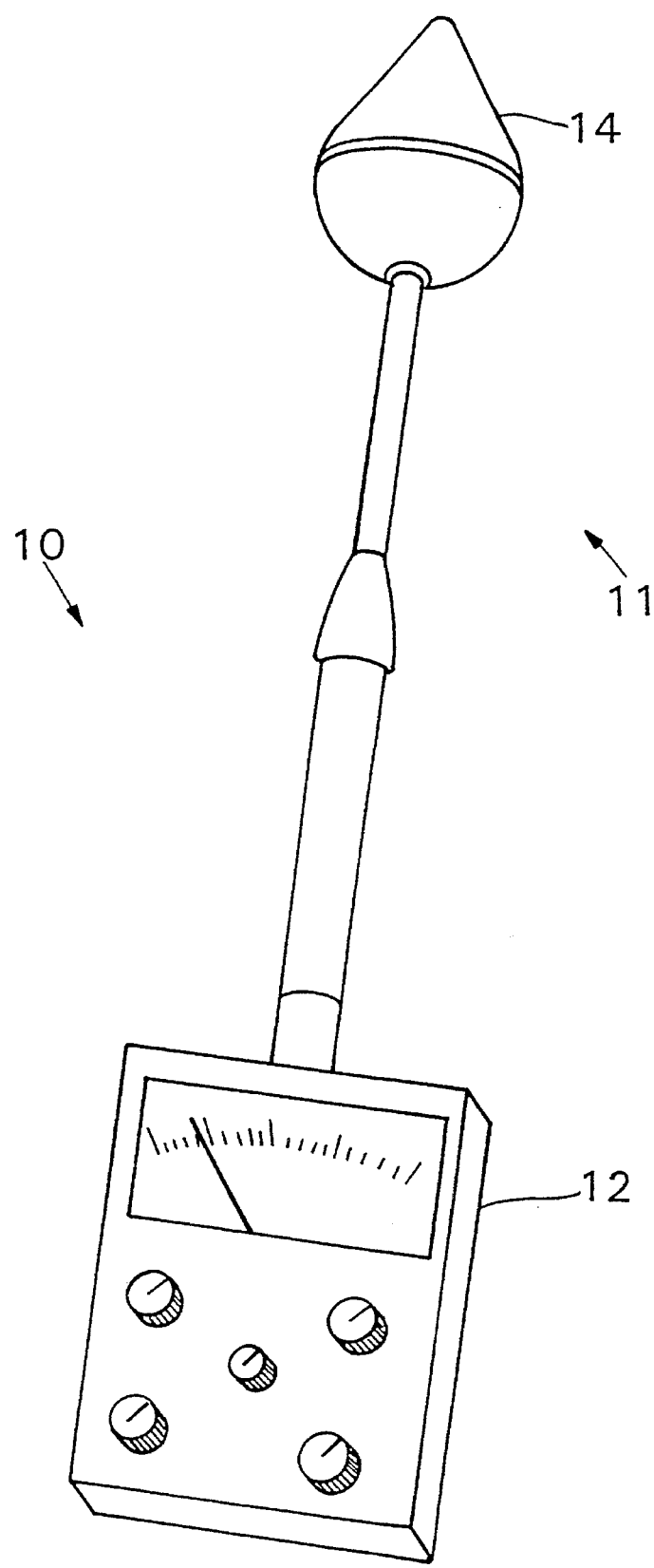
FIG. 1 is a perspective view of a radiation measuring system in accordance with the teachings of the present invention.

Referring to FIG. 1, a radiation measuring system 10 is shown which comprises a probe assembly 11 connected to a power density meter 12. The probe 11 comprises a head 14 which contains a plurality of sensors designed to provide H-field detection with improved E-field discrimination as described in detail below.

The power density meter 12 may be of conventional design. A preferred power density meter is the Model 495 Power Density Meter available from General Microwave Corporation, Amityville, N.Y. The use and calibration of the probe assembly 11 is done in a conventional manner as is done with other probes used with the Model 495 Power Density Meter which comprise the RAHAM® systems available from General Microwave Corporation.

Figure 2:
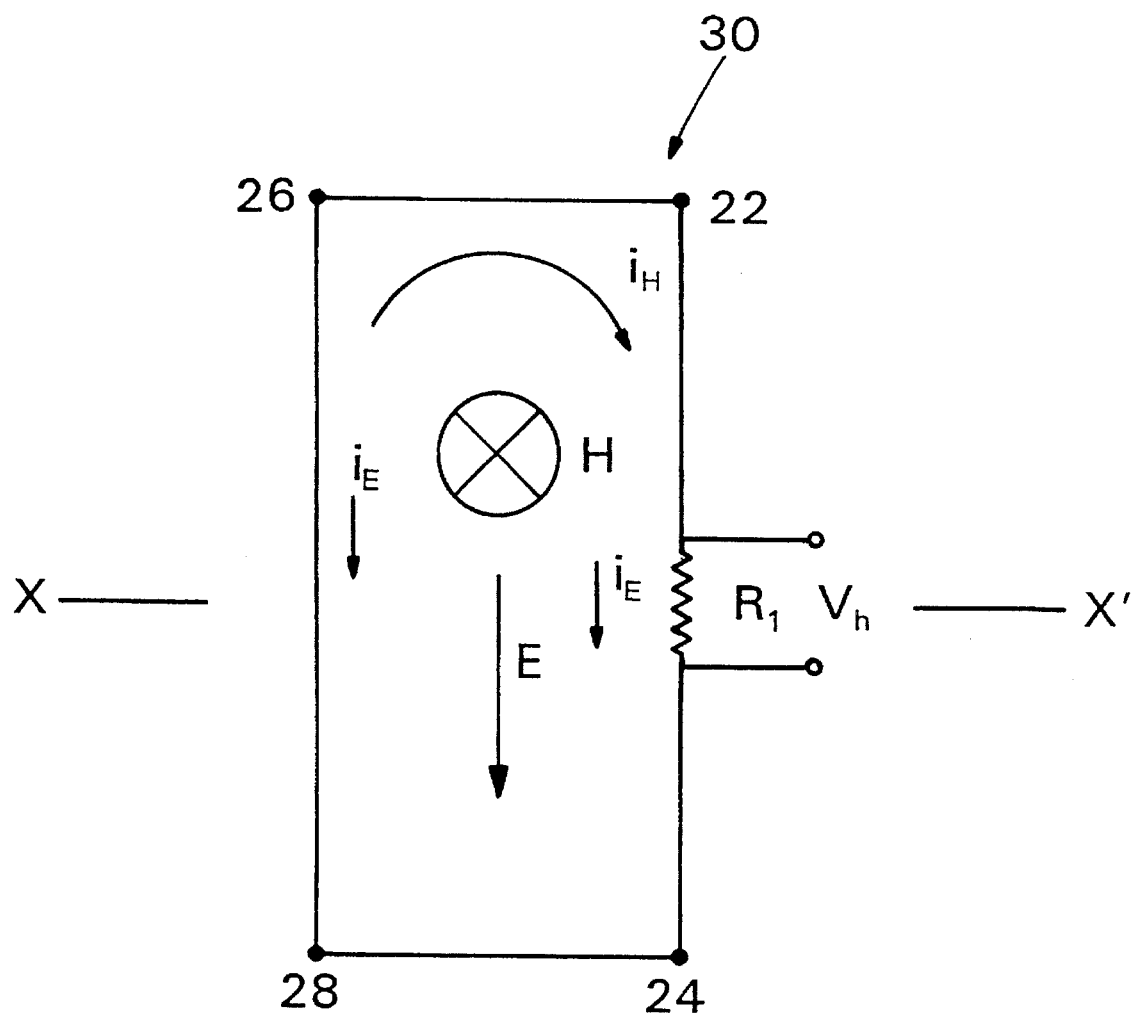
FIG. 2 is a schematic diagram of a conventional magnetic loop.

A conventional detecting circuit for an H-field probe, shown in FIG. 2, comprises a magnetic loop 30. The loop 30 is exposed to time-varying EM radiation which propagates at a velocity c. In a transverse EM field, the E- and H- fields are perpendicular to each other in the plane transverse to the direction of propagation. The magnitudes of the E- and H-fields vary along the direction of propagation, at an angular frequency $\Omega$. For explanatory purposes, as shown in FIG. 2, the loop is orientated so that the H-field is polarized in the direction normal to the plane of the loop 30. Both the E- and H- fields induce current flow within an enclosed loop. Current contributions from each of these sources must be considered for accurate measurements.

In order to simplify the analysis of the effect of the EM field upon the loop 30, several assumptions may be made. With respect to the H-field contribution, if the total circumference $l_1$ of the loop 30 does not exceed $\lambda/2$, where $\lambda=2\pi c/\omega$ is the wavelength of the EM radiation, it is assumed that the loop 30 is electrically small. This assumption remains valid to an upper frequency limit of $\omega_2=\pi c/l_1$. The H-field induces a voltage $e_H=j\omega\mu HnA$ within the loop 30, where A is the area of the loop 30, n represents the number of turns and $\mu=4\pi\times10^{-7}$ Henry/meter is the free space permeability.

A second assumption is that the loop 30 is lossless, which implies that the internal loop impedance is purely inductive, namely $Z_1=j\omega L_1$. The loop inductance $L_1$ depends on the shape, total loop circumference $l_1$, and cross-section of the wire comprising the loop 30. The inductance of $L_1$ can be considered a constant up to the frequency $\omega_2$. Therefore, the H-field induced loop current $i_H = e_H/Z_1 = \mu H n A/L_1$ is considered to be frequency independent.

A resistor $R_1$ inserted into the loop 30 does not affect the loop current $i_H$, assuming the resistor $R_1$ is small compared to the magnitude of the loop impedance $Z_1$. The lower frequency limit of the assumption is $\omega_1 = R_1/L_1$. Consequently, the rf voltage across the resistor $R_1$ is constant over the bandwidth from $\omega_1$ to $\omega_2$ and is given by Equation (1) below.

$$v_h = \mu H n A \omega_1 \quad \omega_1 \leq \omega \leq \omega_2 \tag{1}$$

With respect to the E-field current contribution, when the E-field is polarized in the plane of the loop 30, a voltage of $e_E = E l_{eff}$ is induced in the loop 30. The maximum E-field current contribution occurs when the E-field is polarized along the longer sides of the loop 30, as shown in FIG. 2. The conductive wire between the points 22 and 24 of length $l_2$ can be considered to be an electrically short dipole for which $l_{eff}=l_2/2$. Accordingly, the magnitude of the induced current is has an essentially triangular distribution which peaks at the midpoint and vanishes at the endpoints. Given the dipole admittance of $j\omega C_a$, where $C_a$ is the coupling capacitance, the induced current at the midpoint is $i_E=j\omega C_a e_E$. Using the approach by Hopfer and Adler in "An Ultra Broad-band (200 kHz–26 GHz) High Sensitivity Probe", IEEE Trans. Instr. Measurement, Vol. IM-29, No. 4, pp 445–451, reference as if fully set forth, the value of the capacitance $C_a$, which depends on the length of the dipole and its cross-section, can be calculated. The E-field induced voltage $V_E$ across the resistor $R_1=\omega_1 L_1$, in terms of the lower cut-off frequency $\omega_1$ and the loop parameters is given below by Equation 2:

$$v_E = j\omega C_a L_1 \omega_1 \frac{l_1}{2} E \tag{2}$$

As shown by Equation (2), the voltage $v_E$ is proportional to the angular frequency. Thus, the voltage across resistor $R_1$ has two components, $v_H$ and $v_E$, which are related to the contributions from the E- and H- fields. The resultant voltage $v_1$ depends on the E-field polarization and on the $|E|/|H|$ ratio and is frequency dependent. Although in free space $|E|/|H|$ is constant at 377$\Omega$, the ratio can vary extensively near sources and scatterers. Measurement of H-field strength based upon an assumed constant $|E|/|H|$ ratio is therefore unreliable. The conventional solution to this problem is to shield the loop in an attempt to eliminate the E-field interaction.

Figure 3:
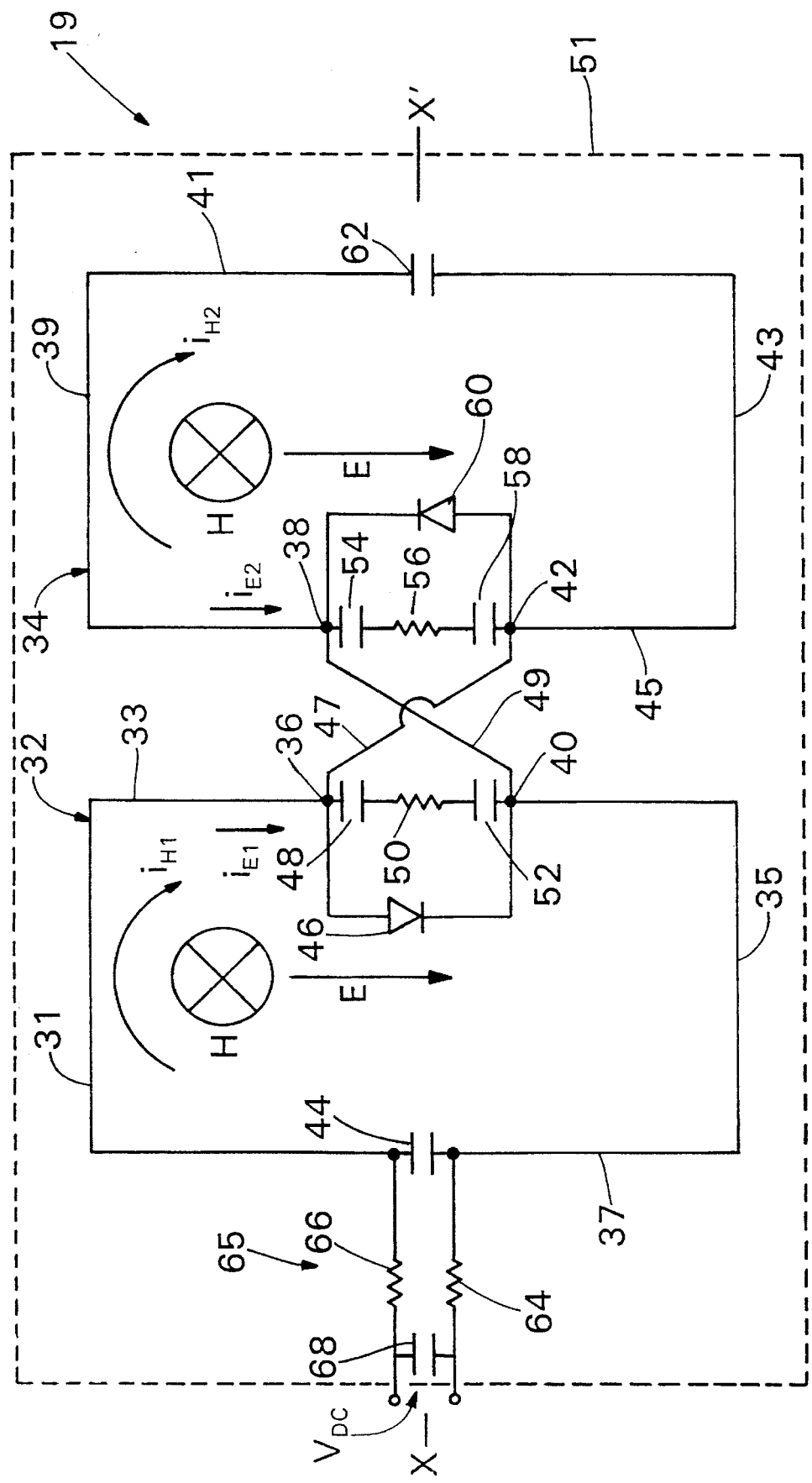
FIG. 3 is a schematic diagram of a pair of symmetrical planar magnetic loops made in accordance with the teachings of the present invention.

An H-field detector circuit 19 with enhanced E-field discrimination made in accordance with the teachings of the present invention is shown in FIG. 3. The detector circuit 19 comprises a pair of symmetrical rectangular magnetic loops 32, 34 mounted adjacent to each other on a substrate 51. Preferably, the loops 32, 34 have longer sides 33, 37, 41, 45 0.7 inches in length and shorter sides 31, 35, 39, 43 0.5 inches in length and are made of copper deposited on a substrate of Duroid® manufactured by the Rogers Company.

Each loop 32, 34 includes a resistor 50, 56 located at the mid-point of one of the longer loop sides 33, 45 in series with two capacitors 48, 52, 54, 58 on either side of each resistor 50, 56. Capacitors 44, 62 are also provided in each loop 32, 34 directly opposite the location of the resistors 50, 56. A DC measuring circuit 65, comprising two resistors 64, 66 and a capacitor 68 is connected to the pair of symmetrical loops 32, 34. The capacitors 44, 48, 52, 54, 58, 62 are used to avoid shorting the detected DC voltage $V_{DC}$.

For best performance, the values of the corresponding electrical elements are chosen such that the symmetry of the loops 32, 34 is maintained as precise as possible. Example values of the various electrical elements for a probe effective in the preferred frequency range of 10 MHz to 1000 MHz in FIG. 3 are shown below in Table 1. The component values are selected based upon the frequency range which is desired.

TABLE 1

| ELEMENT | VALUE |
|---|---|
| Capacitors | |
| 44, 48, 52, 54, 58, 62, 68 | 10 nF |
| Resistors | |
| 50, 56 | 6Ω |
| 64, 66 | 33KΩ |

The loops 32, 34 are electrically coupled via two symmetrically located conductors 47, 49; one conductor 47 between point 36 of loop 32 and point 42 of loop 34 and the other conductor 49 between point 38 of loop 34 and point 40 of loop 32. This configuration for the electrical coupling of the pair of loops 32, 34 has the effect of causing the current induced in each loop by exposure of the loop pair to an E-field to cancel. As explained below, due to the symmetry of the loops 32, 34 the E-field induced current for each loop 32, 34 is substantially the same so that virtually a complete cancellation of the E-field induced current occurs.

Since the value of each resistor 50, 56 is $2R_1$ which is small compared to the loop impedance, each loop 32, 34 "sees" the parallel combination of both resistors, namely $R_1$. Consequently, the induced currents in each loop 32, 34 are not affected by the interconnection. Since the configuration of the loops 32, 34 is symmetrical with respect to each other and the values of the corresponding electrical elements are the same, the magnitudes of the voltages $v_{50}$ and $v_{56}$ across each resistor 50, 56 are equal:

$$v_{50}-v_{56}=[(i_{H1}+i_{H2})+(i_{E1}-i_{E2})]R_1=v_o \tag{3}$$

where the indexes $H_1$, $H_2$, $E_1$ and $E_2$ refer to respective H- and E-field induced currents in each loop 32, 34. Given symmetrical loops 32, 34 with identities $i_{H1}=i_{H2}=i_H$ and $i_{E1}=i_{E2}=i_E$, the net voltage $v_o$ is inherently independent of E-field and purely a function of the H-field given in Equation 3:

$$v_o=2R_1 i_H=2v_H \tag{3}$$

where $v_H$ is the field response of the unbalanced loop 30 in Equation 1.

In theory, the balanced arrangement has an infinite E-field rejection. However, in practice, the symmetry will be limited by physical constraints.

For broadband applications, each loop 32, 34 also includes a square law detector, such as a beam lead Schottky diode 46, 60 connected in parallel with the series configuration of capacitors 48, 52, 54, 58 and the resistor 50, 56. Physical symmetry and reverse polarity, shown in FIG. 3, must be preserved.

In narrow band and single frequency applications, a suitable balun feedline may alternatively be used in lieu of the measuring circuit 65 and diodes 46, 60 to increase the dynamic range of the H-field detector circuit 19. The balun feedline would be connected between the midpoints of coupling conductors 47, 49.

Figure 4:
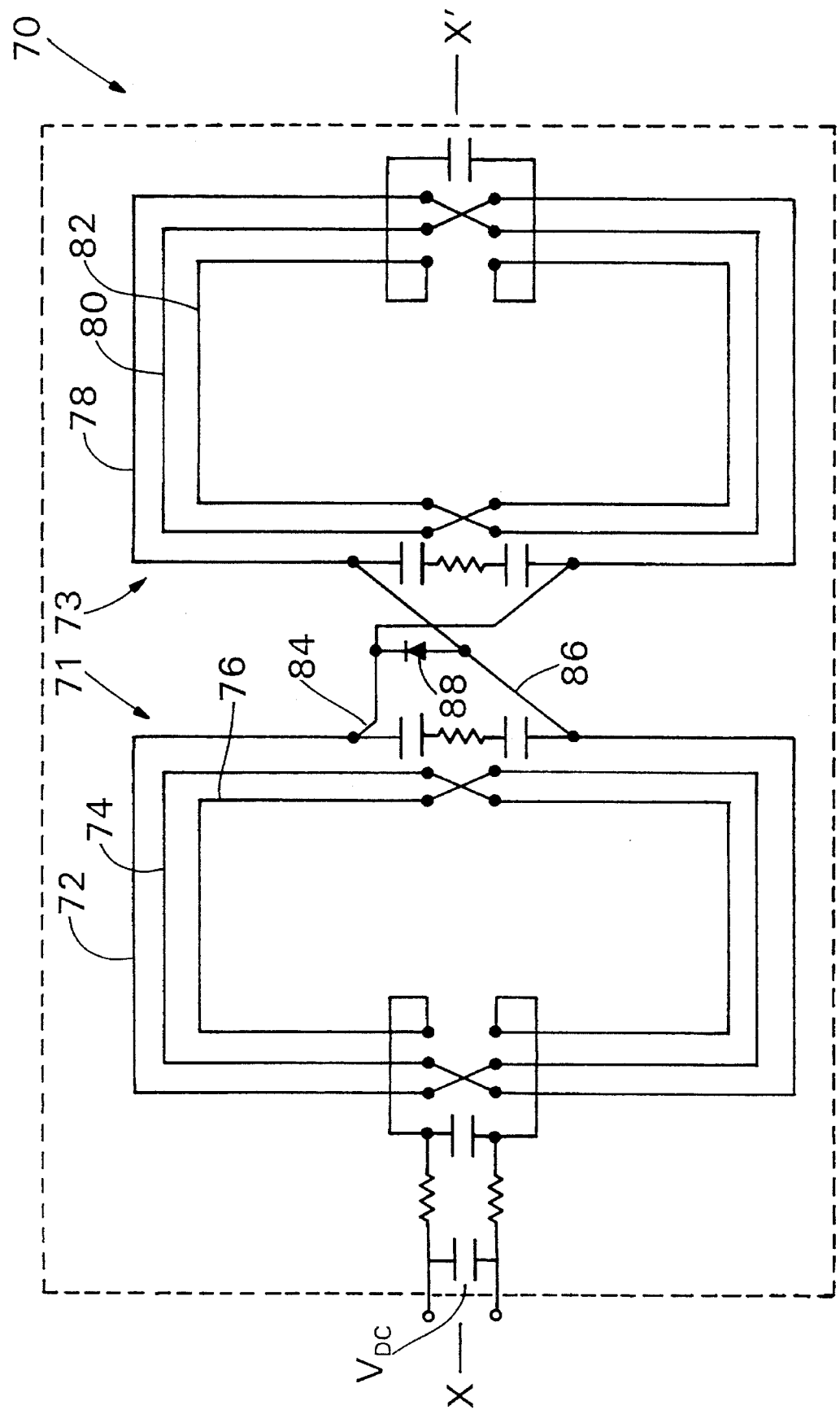
FIG. 4 is a alternate embodiment of a pair of symmetrical planar magnetic loops made in accordance with the teachings of the present invention.

As will be recognized to those of ordinary skill in the art, a variety of alternatives can be employed in the configuration of the detection circuit 19. For example, the pair of diodes 46, 54 in FIG. 3 can be replaced by a single diode 88 connected between the midpoints of conductors 84, 86 as shown in FIG. 4. The use of a chip diode is most suitable for this arrangement, as it best preserves the symmetry requirement.

Additionally, the configuration of the loops 32, 34 is not limited as long as symmetry is maintained. For example in FIG. 4, a pair of loops 71, 73 are shown comprising a series of nested loops 72, 74, 76, 78, 80, 82. While it is preferred that the loops 71, 73 be mounted adjacent to each other, they can be superimposed over each other.

The physical symmetry of the loops 71, 73 is the most critical issue for optimum performance of the H-field probe 18. In the prior discussion, the E-field was shown as polarized along the longer sides of the loop 30 as shown in FIG. 2. When the E-field is polarized in the perpendicular direction, along the X—X' axis shown in FIG. 2, then the potentials at points 22 and 24 are equal as long as the loop has a symmetry along the X—X' axis and the field is uniform. No E-field induced current will flow through the resistor $R_1$. A single turn loop has inherently such a symmetry. However, in a planar implementation of a multiturn loop the X—X' symmetry is not always readily obtained. An example of an implementation of a multiturn loop with proper symmetry is shown in FIG. 4. The values of the resistors 73, 79 are 14Ω, whereas the values of the remaining electrical components shown in FIG. 4 are the same as in the prior embodiment.

As shown in FIG. 5, the preferred embodiment of the H-Probe includes three detecting circuits 92, 94, 96 mounted equally spaced, but in different planes, within the probe head 14. The planar orientation of the detector circuits 92, 94, 96 with respect to each other is selected such that an accurate H-field measurement is obtained irrespective of the angle of propagation of the electromagnetic radiation which is being measured. As will be recognized by those of ordinary skill in the art, different configurations are suitable depending upon whether isotropic or anisotropic response is desired. FIG. 5 depicts an isotropic probe configuration where the planar orientation of each of the detector circuits 92, 94, 96 is 35°15' from an axis perpendicular to the plane of the figure.

The invention has been described in conjunction with a presently preferred embodiment. Other variations with respect to the embodiment described above will be apparent to those of ordinary skill in the art and are within the scope of the present invention.

What is claimed is:

1. A magnetic field probe comprising:
    first and second symmetrical electrical loops mounted in close proximity defining a symmetric loop pair in a fixed relationship to each other;
    means for electrically coupling said loops such that:
        a current induced in said first loop from exposure of said loop pair to an electric field is offset by the current induced in said second loop from exposure of said loop pair to the electric field; and
        a current induced in said first loop from exposure of said loop pair to a magnetic field is combined with the current induced in said second loop from exposure of said loop pair to the magnetic field; and
    lead means for measuring the current induced in said loop pair from exposure of said loop pair to an electromagnetic field whereby the measurement is substantially equal to the amount of current induced by the magnetic field portion of the electromagnetic field.

2. A magnetic field probe according to claim 1 wherein said coupled loop pair is substantially planar.

3. An isotropic probe according to claim 2 further comprising at least three substantially planar coupled loop pairs having a common mount at one end and radiating outwardly in different planes.

4. A magnetic field probe according to claim 2 wherein said loops are substantially rectangular, each loop having a long side including a resistor at the midpoint of said side; and
    wherein said coupling means comprises a pair of conductors connected approximate to and on opposite sides of said resistor of each said loop.

5. A magnetic field probe according to claim 4 wherein each said loop comprises a single rectangle.

6. A magnetic field probe according to claim 4 wherein each said loop comprises a plurality of rectangular sub-loops.

7. A magnetic field probe according to claim 4 wherein each said loop includes a capacitor at the midpoint of a second long side.

8. A magnetic field probe according to claim 4 further comprising at least one square law detector associated with said lead means for measuring current induced by an EM field.

9. A magnetic field probe according to claim 8 wherein a diode is electrically coupled to each loop at opposite ends of the loop's resistor.

10. A magnetic field probe according to claim 8 wherein said square law detector comprises a single diode electrically coupled between the midpoints of a pair of coupling conductors.

11. A radiation measuring system comprising:
    a probe including:
        first and second symmetrical electrical loops mounted in close proximity defining a symmetric loop pair in a fixed relationship to each other;
        means for electrically coupling said loops such that:
            a current induced in said first loop from exposure of said loop pair to an electric field is offset by the current induced in said second loop from exposure of said loop pair to the electric field; and
            a current induced in said first loop from exposure of said loop pair to a magnetic field is combined with the current induced in said second loop from exposure of said loop pair to the magnetic field; and
        lead means for measuring the current induced in said loop pair from exposure of said loop pair to an electromagnetic field whereby the measurement is substantially equal to the amount of current induced by the magnetic field portion of the electromagnetic field; and
    a radiation meter coupled with said lead means of said probe.

12. The system of claim 11 wherein said coupled loop pair is substantially planar.

13. The system of claim 12 further comprising at least three substantially planar coupled loop pairs having a common mount at one end and radiating outwardly in different planes.

14. The system of claim 12 wherein said loops are substantially rectangular, each loop having a long side including a resistor at the midpoint of said side; and wherein said coupling means comprises a pair of conductors connected approximate to and on opposite sides of said resistor of each said loop.

15. The system of claim 14 wherein each said loop comprises a single rectangle.

16. The system of claim 14 wherein each said loop comprises a plurality of rectangular sub-loops.

17. The system of claim 14 wherein each said loop includes a capacitor at the midpoint of a second long side.

18. The system of claim 14 further comprising at least one square law detector associated with said lead means for measuring current induced by an EM field.

19. The system of claim 18 wherein a diode is electrically coupled to each loop at opposite ends of the loop's resistor.

20. The system of claim 18 wherein said square law detector comprises a single diode electrically coupled between the midpoints of a pair of coupling conductors.

* * * * *

UNITED STATES PATENT AND TRADEMARK OFFICE
CERTIFICATE OF CORRECTION

PATENT NO. : 5,512,824
DATED : April 30, 1996
INVENTOR(S) : Danny Adler et al.

It is certified that error appears in the above-identified patent and that said Letters Patent is hereby corrected as shown below:

At column 2, line 54, delete "$\Omega$" and insert therefor --$\omega$--.

At column 3, line 29, delete "is" and insert therefor --$i_E$--.

At column 3, line 36, delete "reference as if fully set forth".

At column 4, line 47, delete "$V_{50}$-$V_{56}$" and insert therefor --$V_{50} = -V_{56}$--.

Signed and Sealed this

Twenty-seventh Day of August, 1996

Attest:

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO. : 5,512,824

DATED : Apr. 30, 1996

INVENTOR(S) : Zdenek (Danny) Adler, et al

It is certified that error appears in the above-identified patent and that said Letters Patent is hereby corrected as shown below:

On title page, item [73], insert "Assignee: General Microwave Corporation, Amityville, N.Y."--

Signed and Sealed this

Twelfth Day of November, 1996

Attest:

BRUCE LEHMAN

*Attesting Officer*        Commissioner of Patents and Trademarks